US007320163B2

(12) United States Patent
Xin-Shan et al.

(10) Patent No.: US 7,320,163 B2
(45) Date of Patent: Jan. 22, 2008

(54) METHOD OF MANUFACTURING AN ACTUATOR DEVICE

(75) Inventors: Li Xin-Shan, Nagano-ken (JP); Masami Murai, Nagano-ken (JP); Toshinao Shinbo, Nagano-ken (JP); Maki Ito, Nagano-ken (JP)

(73) Assignee: Seiko Epson Corporation, Tokyo (JP)

( * ) Notice: Subject to any disclaimer, the term of this patent is extended or adjusted under 35 U.S.C. 154(b) by 449 days.

(21) Appl. No.: 11/076,028

(22) Filed: Mar. 10, 2005

(65) Prior Publication Data

US 2005/0210645 A1 Sep. 29, 2005

(30) Foreign Application Priority Data

Mar. 11, 2004 (JP) ............................ 2004-069660
Dec. 27, 2004 (JP) ............................ 2004-376892

(51) Int. Cl.
*H01L 41/08* (2006.01)

(52) U.S. Cl. .................... 29/25.35; 29/890.1; 427/100; 427/419.2; 310/365; 310/345; 347/70

(58) Field of Classification Search ............... 29/25.35, 29/890.1, 846; 310/311, 312, 363, 365, 345; 427/100, 419.2, 419.3; 347/68, 70, 71
See application file for complete search history.

(56) References Cited

U.S. PATENT DOCUMENTS 5,900,283 A * 5/1999 Vakil et al. .......... 427/419.3 X
6,494,567 B2 * 12/2002 Murai ......................... 347/71

FOREIGN PATENT DOCUMENTS

JP 5-177831 * 7/1993 .................. 347/70
JP 2001-274472 A 10/2001

OTHER PUBLICATIONS

Ederer, Ingo., "Droplet Generator with Extraordinary High Flow Rate and Wide Operating Range", Transducers'97, 1997 International Conference on Solid State Sensors and Actuators, Jun. 1997, pp. 809-812.*

* cited by examiner

*Primary Examiner*—A. Dexter Tugbang
(74) *Attorney, Agent, or Firm*—Sughrue Mion, PLLC

(57) ABSTRACT

A step of forming a vibration plate includes a step of forming an insulation film in order to cause the surface roughness Ra of the insulation film to be in the range of 1 nm to 3 nm: the insulation film being made of zirconia which has been obtained by depositing a zirconium layer, and accordingly by the thermally oxidizing the zirconium layer at a predetermined temperature, and the insulation film constituting the uppermost surface of the vibration plate. In addition, a step of forming a piezoelectric elements includes: a step of applying titanium (Ti) onto a lower electrode by use of a sputtering method, and of forming a seed titanium layer thereon; and a step of forming a piezoelectric precursor film by applying a piezoelectric material onto the seed titanium layer, and of forming a piezoelectric layer by baking, and crystallizing, the piezoelectric precursor layer.

7 Claims, 7 Drawing Sheets

Example 1

Comparative Example 1

METHOD OF MANUFACTURING AN ACTUATOR DEVICE

BACKGROUND OF THE INVENTION

1. Field of the Invention

The present invention relates to a method of manufacturing an actuator device, and to a liquid jet device.

2. Description of the Related Art

An actuator device including piezoelectric elements which make displacement when voltage is applied is mounted, for example, onto a liquid jet head and the like which ejects droplets. As such a liquid jet head, for example, an ink-jet recording head as follows has been known. With regard to the ink-jet recording head, part of each of pressure generating chambers, which communicate respectively with nozzle orifices, is composed of a vibration plate. This vibration plate is caused to be deformed by the piezoelectric elements, thus pressurizing ink in the corresponding pressure generating chamber. Thereby, ink droplets are ejected from the nozzle orifices. In addition, for the ink-jet recording head, there have been two types which are put into practical use: one being mounted with a piezoelectric actuator device of longitudinal vibration mode, which extends and contracts in the axial direction of the piezoelectric element; and the other being mounted with a piezoelectric actuator device of flexure vibration mode. For ink-jet recording heads using the actuator of flexure vibration mode, there has been an ink-jet recording head having piezoelectric elements which have been formed in the following process: for example, an even piezoelectric layer is formed on the entire surface of the vibration plate by a deposition technique. Thereafter, the piezoelectric layer is cut into pieces, each of which has a shape corresponding to each of the pressure generating chambers by use of a lithography technique. Thus, piezoelectric elements are formed in a way that the piezoelectric elements in the respective pressure generating chambers are independent of one another.

For this piezoelectric layer (piezoelectric thin film) for example, ferroelectrics such as lead-zirconate-titanate (PZT) is used. In addition, such a piezoelectric thin film is formed in the following process: for example, titanium crystals are deposited on a lower electrode by use of a sputtering method or the like. Thereafter, a piezoelectric precursor film is formed on the titanium crystals by use of a sol-gel method. Then, this piezoelectric precursor film is baked, and accordingly, the piezoelectric thin film is formed (see Patent Document 1, for example).

If the piezoelectric layer were formed in such a manner, crystals of the piezoelectric layer could be grown with titanium crystals serving as nuclei. Accordingly, columnar crystals respectively with relatively high denseness could be obtained. However, it is difficult to control the crystallinity of the piezoelectric layer, and it is not possible to homogenize electrical or mechanical characteristics of the piezoelectric layer. This brings about a problem that displacement characteristics of the respective piezoelectric elements are uneven. Incidentally, such a problem is caused not only when an actuator device which is going to be mounted onto a liquid jet head such as an ink-jet recording head and the like is manufactured, but also when an actuator device which is going to be mounted onto another apparatus is manufactured.

(Patent Document 1)

Japanese Unexamined Patent Publication No. 2001-274472, p. 5.

SUMMARY OF THE INVENTION

With the aforementioned matters taken into consideration, an object of the present invention is to provide a method of manufacturing an actuator device, and a liquid jet head, which can improve characteristics of a piezoelectric layer constituting piezoelectric elements and can stabilize the characteristics of the piezoelectric layer.

A first aspect of the present invention to solve the aforementioned problem is a method of manufacturing an actuator device which includes the steps of: forming a vibration plate on one surface of a substrate; and forming on the vibration plate a piezoelectric element including a lower electrode, a piezoelectric layer and an upper electrode. The step of forming the vibration plate is characterized by including a step of forming a zirconium layer, and thermally oxidizing the zirconium layer at a predetermined temperature to form an insulation film made of zirconia, the insulation film being an uppermost layer of the vibration plate and having a surface roughness Ra ranging from 1 nm to 3 nm. In addition, the step of forming the piezoelectric element is characterized by including a step of applying titanium (Ti) onto the lower electrode by use of a sputtering method, and forming a seed titanium layer thereon; and a step of forming the piezoelectric precursor film by applying a piezoelectric material onto the seed titanium layer, and forming the piezoelectric layer by baking and crystallizing the piezoelectric precursor layer.

The first aspect could improve characteristics of the piezoelectric layer by performing a control for the surface roughness of the insulation film, which is bedding of the piezoelectric layer, to be not larger than a predetermined value.

A second aspect of the present invention is the method of manufacturing an actuator device according to the first aspect, which is characterized by causing the surface roughness Ra of the insulation film to be larger than 2 nm in the step of forming the insulation film.

The second aspect could further improve the characteristics of the piezoelectric layer.

A third aspect of the present invention is the method of manufacturing an actuator device according to any one of the first and the second aspects, which is characterized by causing the degree of orientation of the (002) plane of the zirconium layer to be larger than 80% in the step of forming the insulation film form.

The third aspect could form an insulation film of excellent crystallinity with a desired surface roughness by controlling the crystalline orientation of the zirconium layer.

A fourth aspect of the present invention is the method of manufacturing an actuator device according to any one of the first to the third aspects, which is characterized in that, while the zirconium layer is being oxidized thermally, the heating temperature is equal to, or lower than, 900° C.

The fourth aspect could perform a control for the surface roughness of the zirconium layer to be larger, and accordingly could control the crystallinity of the piezoelectric layer more easily.

A fifth aspect of the present invention is the method of manufacturing an actuator device according to any one of the first to the fourth aspects, which is characterized by forming the seed titanium layer at a thickness of 1 nm to 8 nm in the step of forming the seed titanium layer.

The fifth aspect would form the seed titanium layer at a predetermined thickness, thereby improving the crystallinity of the piezoelectric layer securely.

A sixth aspect of the present invention is the method of manufacturing an actuator device according to any one of the first to the fifth aspects, which is characterized in that, while the seed titanium layer is being formed, the power density is 1 $kW/m^2$ to 4 $kW/m^2$.

The sixth aspect would form more seed titanium which serves as nucleus of the piezoelectric layer, thereby further improving the crystallinity of the piezoelectric layer.

A seventh aspect of the present invention is the method of manufacturing an actuator device according to any one of the first to sixth aspects, which is characterized by applying titanium (Ti) onto the lower electrode at least twice or more, in the step of forming the seed titanium layer.

The seventh aspect would form more seed titanium which serves as nucleus of the piezoelectric layer, thereby further improving the crystallinity of the piezoelectric layer.

An eighth aspect of the present invention is a liquid jet device which is characterized by including a head which uses an actuator manufactured by use of the manufacturing method according to any one of first to seventh aspects is used as liquid ejecting means.

The eighth aspect could improve the displacement characteristic of the piezoelectric element, thereby enabling the liquid jet device with its improved characteristic concerning ejecting liquid to be manufactured more easily and more securely.

DESCRIPTION OF THE PREFERRED EMBODIMENTS

Detailed descriptions will be provided below for the present invention on the basis of the embodiment.

Figure 1:
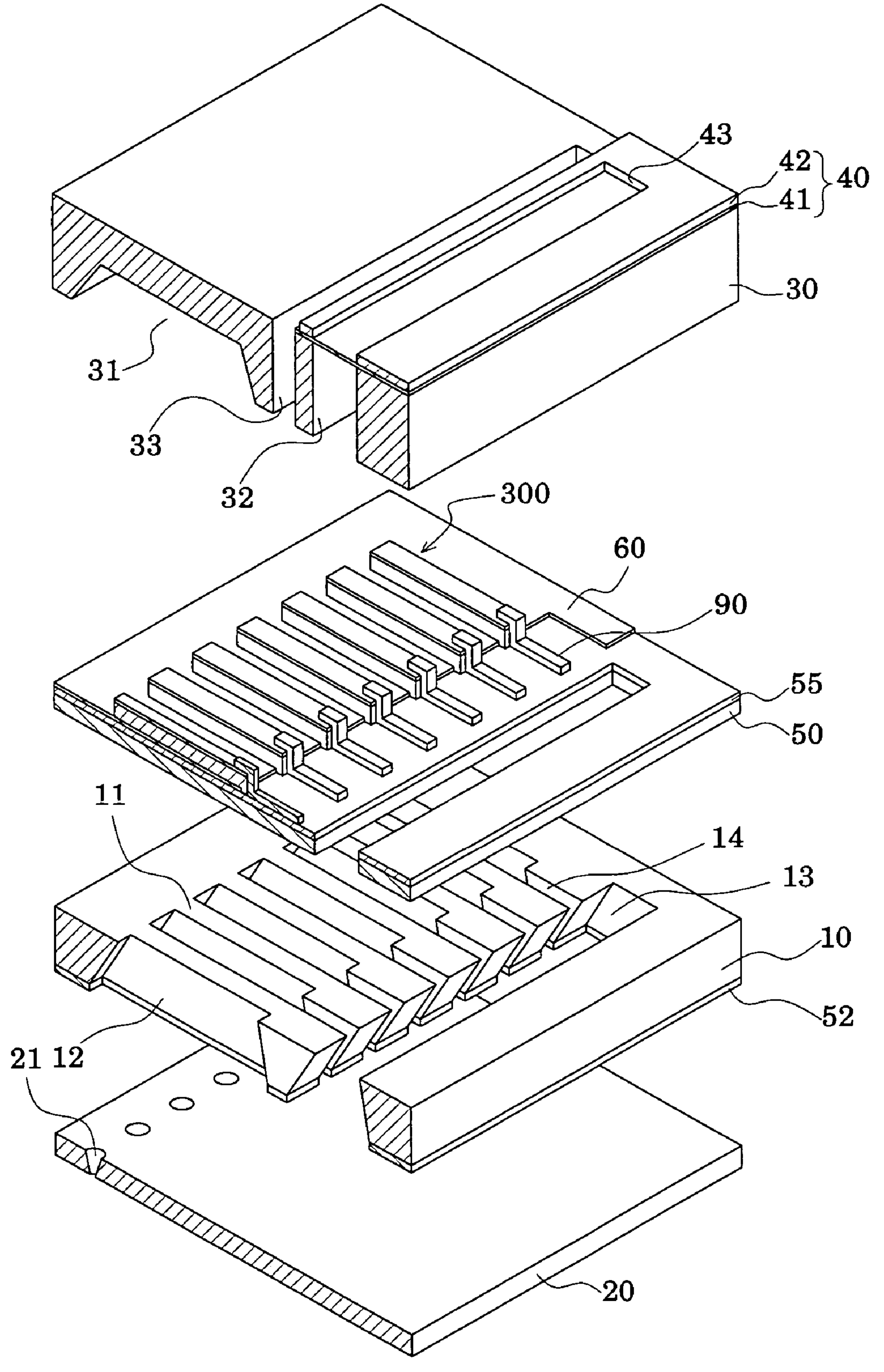
FIG. 1 is an exploded, perspective view showing a recording head according to a first embodiment.
Figure 2A:
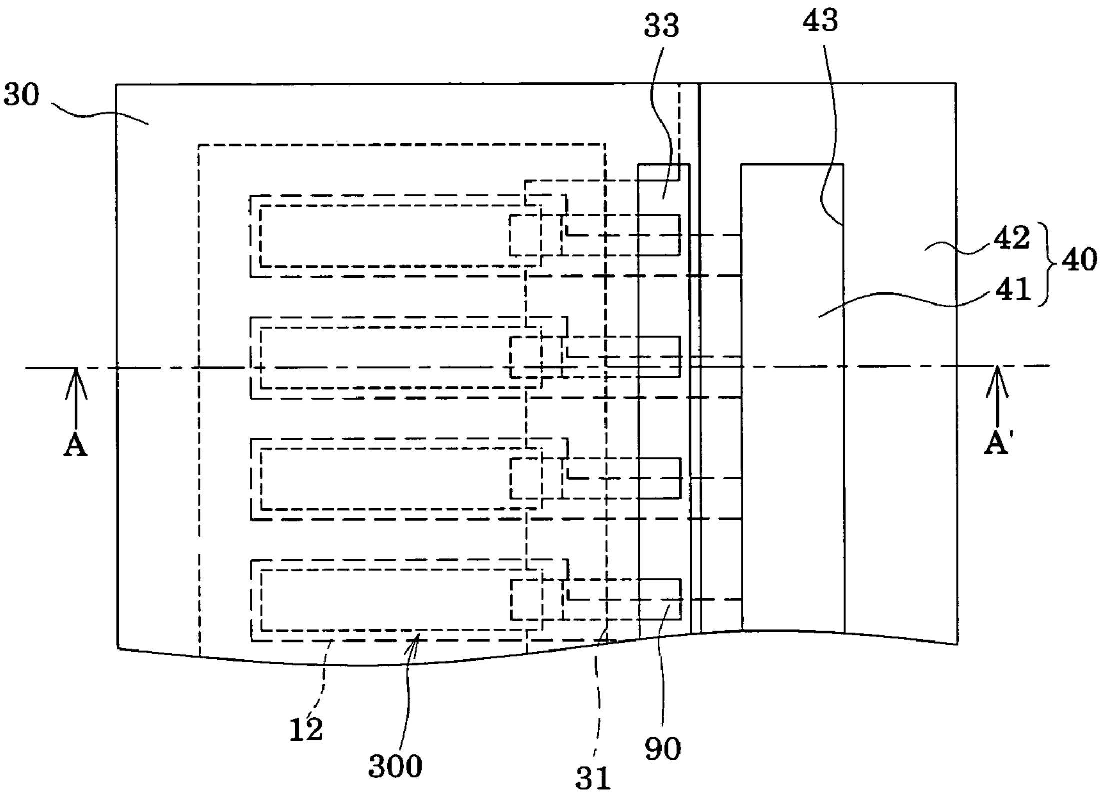
FIGS. 2(A) and 2(B) are respectively a plan view and a cross-sectional view, both of which show the recording head according to the first embodiment.
Figure 2B:
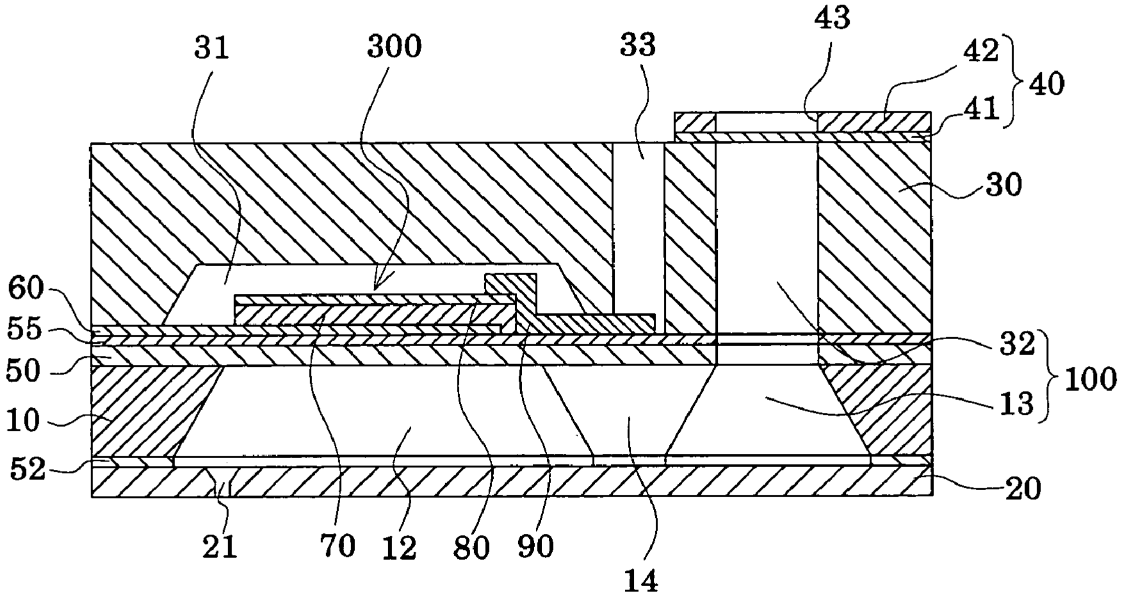

FIG. 1 is an exploded, perspective view showing an ink-jet recording head according to a first embodiment of the present invention. FIGS. 2A and 2B are respectively a plan view and a cross-sectional view showing the ink-jet head of FIG. 1. As illustrated, a passage-forming substrate 10 is made of a single crystal silicon substrate of the (110) plane orientation in the present embodiment. An elastic film 50 with a thickness of 0.5 μm to 2.0 μm made of silicon dioxide, which has been formed beforehand by thermal oxidation, is formed on one surface of the passage-forming substrate 10. In the passage-forming substrate 10, a plurality of pressure generating chambers 12 are arrayed in the width direction of the passage-forming substrate 10: the plurality of pressure generating chambers 12 has been fabricated by etching the other surface of the passage-forming substrate 10 anisotropically, and subsequently by partitioning the surface with compartment walls 11. In addition, a communicating portion 13 is formed in an area outside the pressure generating chambers 12 in the passage-forming substrate 10 in the longitudinal directions thereof. The communication portion 13 and each of the pressure generating chambers 12 communicate with each other through each of ink supply paths 14 which are provided to the respective pressure generating chambers 12. Incidentally, the communicating portion 13 communicates with a reservoir portion of a protective plate, which will be described later, and constitutes parts of a reservoir which is an ink chamber commonly used by each of the pressure generating chambers 12. Each of the ink supply paths 14 is formed so as to have a width which is narrower than each of the pressure generating chambers 12. Accordingly, each of the ink supply paths 14 maintains a path resistance against ink to be constant, the ink flowing into each of the pressure generating chambers 12 from the communicating portion 13.

In addition, a nozzle plate 20 is fixed to an aperture surface of the passage-forming substrate 10 with a masking film 52, which will be described later, interposed between the nozzle plate 20 and the passage-forming substrate 10, by use of an adhesive agent, a thermal adhesive film or the like; in the nozzle plate 20, nozzle orifices 21 which communicate respectively with the vicinities of the ends of the pressure generating chambers 12 on the sides opposite to the ink supply paths 14 are drilled. Incidentally, the nozzle plate 20 is fabricated of a glass ceramic, a single crystal silicon substrate, a stainless steel or the like, having a thickness, for example, of 0.01 mm to 1.00 mm and a coefficient of linear expansion, for example, of 2.5 to 4.5 [$\times 10^{-6}/°$ C.] at a temperature not higher than 300° C.

On the other hand, on the side opposite to the aperture surface of such a passage-forming substrate 10, the elastic film 50 with a thickness, for example, of approximately 1.0 μm made of silicon dioxide ($SiO_2$) is formed, as described above. On the elastic film 50, an insulation film 55 with a thickness, for example, of approximately 0.4 μm made of zirconia ($ZrO_2$) is formed. Additionally, on the insulation film 55, a lower electrode film 60 having a thickness, for example, of 0.1 μm to 0.2 μm, a piezoelectric layer 70 having a thickness, for example, of approximately 1.0 μm, and an upper electrode film 80 having a thickness, for example, of approximately 0.05 μm are laminate-molded by uses of a process, which will be described later. Accordingly, the lower electrode film 60, the piezoelectric layer 70 and the upper electrode film 80 collectively constitute a piezoelectric element 300. At this point, the piezoelectric element 300 means to be a part which includes the lower electrode film 60, the piezoelectric layer 70 and the upper electrode film 80. In generally, each of the piezoelectric elements 300 is configured by using any one of the two electrodes as a common electrode, and by patterning the other of the two electrodes and the piezoelectric layer 70 for each of the pressure-generating chambers 12. Here, a part, which has been formed of the patterned one of the two electrodes and the piezoelectric layer 70, and which causes piezoelectric strain due to an application of voltage to both of the two electrodes, is termed as a piezoelectric active portion. In the present embodiment, the lower electrode film 60 is an electrode commonly used by the piezoelectric elements 300, and each of the upper electrode films 80 is an individual electrode for each of the piezoelectric elements 300. However, even if these assignments are reversed on account of a drive circuit and wiring, there is no problem caused by this. In any case, the piezoelectric active portion is formed in each of the pressure-generating chambers. Here, the piezoelectric elements 300 and a vibration plate which provides displacement due to drive of the piezoelectric elements 300 are collectively termed as a piezoelectric actuator. Incidentally, in the aforementioned example, the elastic film 50, the insulation film 55 and the lower electrode film 60 collectively play a role of the vibration plate.

In addition, a lead electrode 90 is connected with each of the upper electrode films 80 of the respective piezoelectric elements 300, and a voltage is designed to be applied selectively onto each of the piezoelectric elements 300 through the respective lead electrodes 90.

In the present invention, at this point, it is desirable that the surface roughness (roughness Ra in an arithmetic average) of the insulation film 55 constituting the uppermost surface of the vibration plate which serves as a ground for the piezoelectric layer 70 constituting the piezoelectric elements 300 be in the range of 1 nm to 3 nm. Preferably, the surface roughness is not smaller than 1.5 nm, especially larger than 2.0 nm. Incidentally, the surface roughness Ra of the lower electrode film 60 to be formed on such an insulation film 55 is not larger than 1 nm to 3 nm. Although detailed descriptions will be provided later, if the surface roughness Ra of the insulation film 55 would be caused to be relatively large, characteristics of the piezoelectric layer 70 to be formed on this insulation film 55 could be improved.

A protective plate 30, which has a piezoelectric element holding portion 31 in an area facing the piezoelectric elements 300, is jointed onto the surface of the passage-forming substrate 10 on the side of the piezoelectric element 300 with an adhesive agent. Since the piezoelectric elements 300 are formed in a way that the piezoelectric elements 300 are situated within the piezoelectric element holding portion 31, the piezoelectric elements 300 are protected in a state where the piezoelectric elements 300 are affected by almost no influence of the external environment. The piezoelectric element holding portion 31 may be unnecessarily sealed. In addition, the protective plate 30 is provided with a reservoir portion 32 in an area corresponding to the communicating portion 13 of the passage-forming substrate 10. In the present embodiment, the reservoir portion 32 is provided, in the same direction as the pressure-generating chambers 12 are arranged, in a way that the reservoir portion 32 penetrates through the protective plate 30 in the thickness direction thereof. As described above, the reservoir portion 32 is caused to communicate with the communicating portion 13 of the passage-forming substrate 10, thus constituting a reservoir 100 which is used commonly by the pressure generating chambers 12.

Furthermore, a through-hole 33, which penetrates through the protective plate 30 in the thickness direction thereof, is provided in an area between the piezoelectric element holding portion 31 of the protective plate 30 and the reservoir portion 32. A part of the lower electrode film 60 and an extremity of each of the lead electrodes 90 are exposed to the inside of the through-hole 33. Although not illustrated, one end of connecting wiring is connected with a drive IC, and the other end of the connecting wiring is connected with the lower electrode film 60 and the lead electrodes 90.

It should be noted that, as a material for the protective plate 30, for example, glass, a ceramic material, a metal, a resin and the like can be listed. However, it is preferable that the protective plate 30 be made of a material having almost the same coefficient of thermal expansion as the material of the passage-forming substrate 10 has. In the present embodiment, a single crystal silicon substrate, which is the same as the material of the passage-forming substrate 10, is used for the protective plate 30.

Moreover, a compliance plate 40 is jointed onto the protective plate 30; the compliance plate 40 is constituted of a sealing film 41 and a fixed plate 42. The sealing film 41 is fabricated of a flexible material with low rigidity (for example, a polyphenylene sulfide (PPS) film with a thickness of 6 μm) A surface in one direction of the reservoir portion 32 is sealed off by the sealing film 41. In addition, the fixed plate 42 is fabricated of a rigid material such as a metal (for example, stainless steel (SUS) with a thickness of 30 μm or the like). An area in this fixed plate 42 facing the reservoir 100 is an opening portion 43 which has been obtained by completely removing the corresponding part of the fixed plate 42 in the depth direction thereof. For this reason, the surface in the aforementioned direction of the reservoir 100 is sealed off by only the sealing film 41, which is flexible.

The ink-jet recording head according to the present invention, which has been described, takes in ink from external ink supply means, which is not illustrated, and fill its interior, ranging from the reservoir 100 to the nozzle orifices 21, with ink. Thereafter, in accordance with recording signals from an IC drive, which is not illustrated, the ink-jet recording head applies a voltage to the interstice between the lower electrode film 60 and a corresponding one of the upper electrode films 80, both of which correspond to each of the pressure generating chambers 12, thus causing the elastic film 50, the insulation film 55, the lower electrode film 60 and the piezoelectric layer 70 to provide displacement respectively. This increases the pressure within each of the pressure-generating chambers 12, thus ejecting ink from corresponding one of the nozzle orifices 21.

Here, descriptions will be provided for a method of manufacturing such an ink-jet recording head with reference to FIGS. 3 to 6. Incidentally, FIGS. 3 to 6 are cross-sectional views showing the pressure generating chamber 12 in the longitudinal direction thereof. As shown in FIG. 3A, first of all, a wafer 110 for a passage-forming substrate, which is a silicon wafer, is thermally oxidized in a diffusion furnace at a temperature of approximately 1,100° C., and thus a silicon dioxide film 51, which will constitute an elastic film 50, is formed on the surface of the wafer 110 for the passage-forming substrate. Incidentally, in the present embodiment, for the passage-forming substrate 10, a silicon wafer with a high rigidity and with a relatively thicker thickness of approximately 625 μm is used.

Figure 3A:
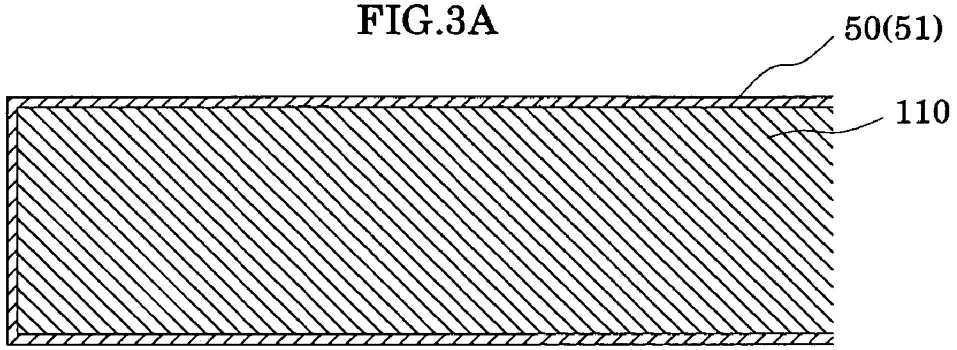
FIGS. 3(A) to 3(D) are cross-sectional views showing steps of manufacturing the recording head according to the first embodiment.
Figure 3B:
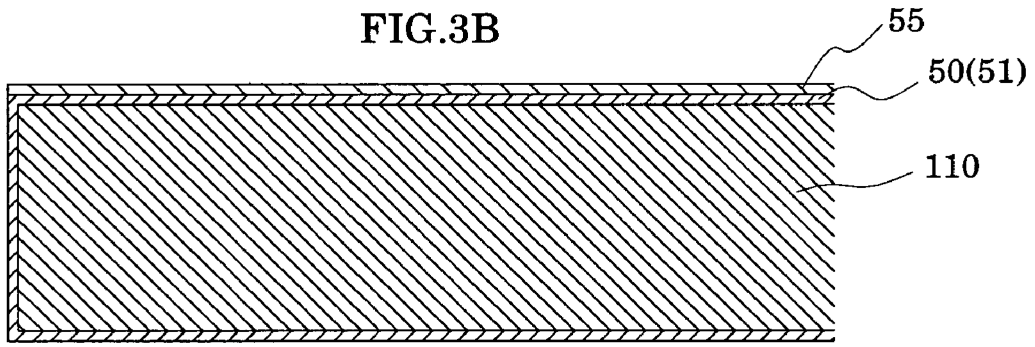

Subsequently, as shown in FIG. 3B, on the elastic film 50 (silicon dioxide film 51), an insulation film 55 made of zirconia is formed. Specifically, on the elastic film 50 (silicon dioxide film 51), a zirconium (Zr) layer is formed by use of a DC sputtering method, an RF sputtering method, or the like. In this instance,the surface roughness (roughness Ra in an arithmetic average) is controlled of the zirconium layer to be 1 nm to 3 nm, preferably 1.5 nm or more, more preferably 2.0 nm or more.

In addition, it is preferable that a degree of orientation of the (002) plane of the zirconium layer be not smaller than 80%. Incidentally, the "degree of orientation," which is mentioned here, means a ratio of diffraction intensity which occurs when X-ray diffraction of the zirconium layer is measured by use of a wide angle method. Specifically, the X-ray diffraction of the zirconium layer is measured by the wide angle method, peaks of the respective diffraction intensities, which correspond respectively to the (100) plane, the (002) plane and the (101) plane, occur. In addition, a "degree of orientation of the (002) plane" means a ratio of a peak intensity, corresponding to the (002) plane, to the summation of the peak intensities corresponding to the respective planes.

Moreover, it is preferable that a sputtering output be caused to be not larger than 500 W while the zirconium layer is being formed in order to cause the surface roughness Ra of the zirconium layer to be in the range of 1 nm to 3 nm. Furthermore, it is preferable that a sputtering temperature be caused to be a normal temperature (approximately 23° C. to 25° C.). In addition, it is preferable that a sputtering pressure be caused to be not lower than 0.5 Pa. Additionally, it is preferable that a target interval (distance between a target and a substrate) be caused to be not longer than 100 mm. If the zirconium layer is to be formed through selecting conditions for the deposition depending on necessity, the surface roughness Ra of the zirconium layer could be controlled in order that the surface roughness would be in range of 1 nm to 3 nm. Concurrently, the degree of orientation of the (002) plane could be caused to be 80% or more.

After the zirconium layer has been formed in the aforementioned manner, this zirconium layer is oxidized thermally, and thus the insulation film 55 made of zirconia is formed. At this point, a heating temperature is 900° C. or less. It is preferable that the heating temperature be caused to be in the range of 700° C. to 900° C. By controlling the heating temperature while the thermal oxidization is being performed in this manner, the insulation film 55 is formed in order to cause the surface roughness Ra thereof to be in the range of 1 nm to 3 nm. In the present embodiment, for example, the wafer 110 for the passage-forming substrate is inserted, at a speed 300 mm/min or more, preferably 500 mm/min or more, into a diffusion furnace under an oxygen atmosphere heated at a temperature of approximately 700° C. to 900° C. Accordingly, the zirconium layer is caused to be oxidized thermally for approximately 15 to 60 minutes.

This enables the insulation film 55 with excellent crystallinity to be obtained. Consequently, the surface roughness Ra of the insulation film 55 is in the range of 1 nm to 3 nm. In other words, each of the zirconium crystals constituting the insulation film 55 is grown almost evenly to be a columnar crystal which is continuous from its bottom to its top. Accordingly, the surface roughness Ra thereof becomes relatively as large as being in the range of 1 nm to 3 nm.

Figure 3C:
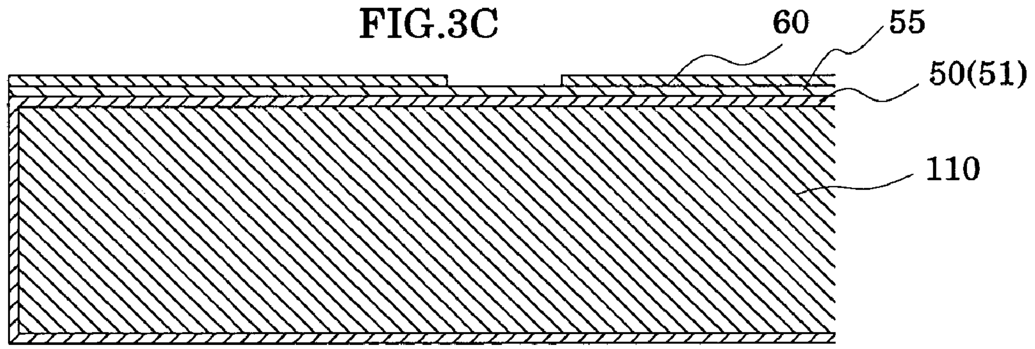

As shown in FIG. 3C, subsequently, the lower electrode film 60 made, for example, of at least platinum and iridium, is formed on the entire surface of the insulation film 55 by a sputtering method or the like. Thereafter, the lower electrode film 60 is patterned in order to cause it to take a predetermined shape. Incidentally, the surface roughness Ra of this lower electrode film 60 depends on the surface roughness Ra of the insulation film 55. For this reason, if the surface roughness Ra of the insulation film 55 were in the range of 1 nm to 3 nm, the surface roughness Ra of the lower electrode film 60 would be in the range of 1 nm to 3 nm.

Figure 3D:
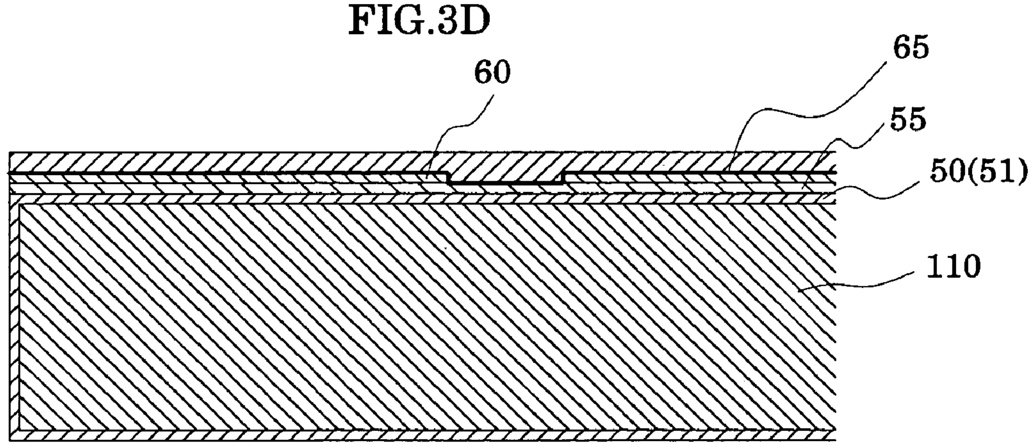

As shown in FIG. 3D, then, titanium (Ti) is applied onto the lower electrode film 60 and the insulation film 55 by a sputtering method. If a DC sputtering method is used, the application is performed twice or more. In the present embodiment, however, the application is performed twice. Thereby, a seed titanium layer 65, which is continuous with a predetermined thickness, is formed. It is preferable that the seed titanium layer 65 be formed in order to cause the layer thickness thereof to be in the range of 1 nm to 8 nm. That is because, if the seed titanium layer 65 were formed in order to cause it to have such a layer thickness, the crystallinity of the piezoelectric layer 70, which will be formed in a step mentioned below, could be improved.

At this point, sputtering conditions under which to form the seed titanium layer 65 are not limited specifically. However, it is preferable that a sputtering pressure be caused to be in the range of 0.4 Pa to 4.0 Pa. In addition, it is preferable that a sputtering output be caused to be 50 W to 100 W, and that a sputtering temperature is caused to be in range of a normal temperature (approximately 23° C. to 25° C.) to 200° C. Moreover, it is preferable that a power intensity be caused to be in the range of approximately 1 $Kw/m^2$to 4 $Kw/m^2$. Furthermore, if, at this point, titanium were applied twice as described above, this would make it possible to form a large amount of seed titanium, which will serve as crystal nuclei of the piezoelectric layer 70 to be formed in the ensuing step.

Thence, on the seed titanium layer 65 which has been formed in this manner, the piezoelectric layer 70 made, for example, of lead-zirconate-titanate (PZT), is formed. In the present embodiment, the piezoelectric layer 70 made of the PZT is formed by use of a sol-gel method: according to the sol-gel method, a metallic organic compound is dissolved, and dispersed, into a solvent, and thereby what is called sol is obtained; thereafter, the sol is made into gel by applying the sol onto the seed titanium layer 65 and drying the sol; and the gel is baked at a high temperature, and accordingly the piezoelectric layer 70 made of the metallic oxide is obtained.

Figure 4A:
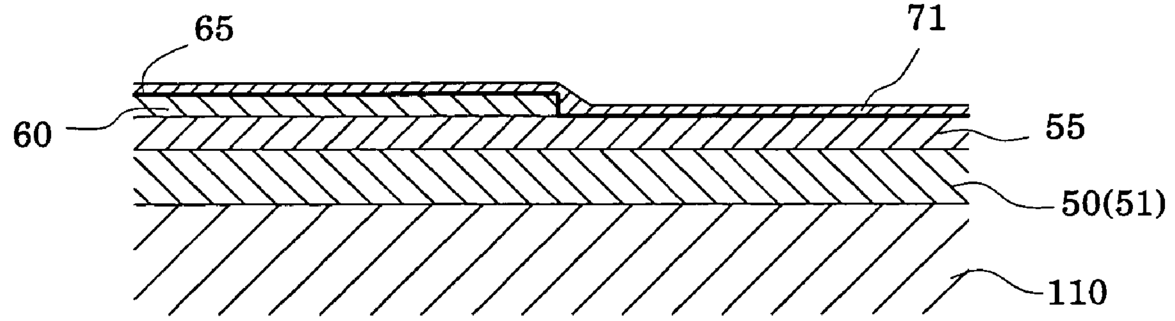
FIGS. 4(A) to 4(C) are cross-sectional views showing steps of manufacturing the recording head according to the first embodiment.

With regard to a procedure of forming the piezoelectric layer 70, as shown in FIG. 4A, first of all, a piezoelectric precursor film 71 which is a PZT precursor film is deposited on the seed titanium layer 65. In other words, a sol (solution) including a metallic organic compound is applied onto the wafer 110 for the passage-forming substrate. Subsequently, the piezoelectric precursor film 71 is heated at a predetermined temperature, and is dried for a predetermined length of time. Thereby, the solvent of the sol is evaporated, and thus the piezoelectric precursor film 71 is dried. In addition, the piezoelectric precursor film 71 is placed in the atmosphere, and is degreased at a predetermined temperature for a predetermined length of time. Incidentally, the "degrease," which has just been mentioned here, means to remove organic elements, which are included in the piezoelectric precursor film 71, for example, as $NO_2$, $CO_2$, $H_2O$ and the like.

Figure 4B:
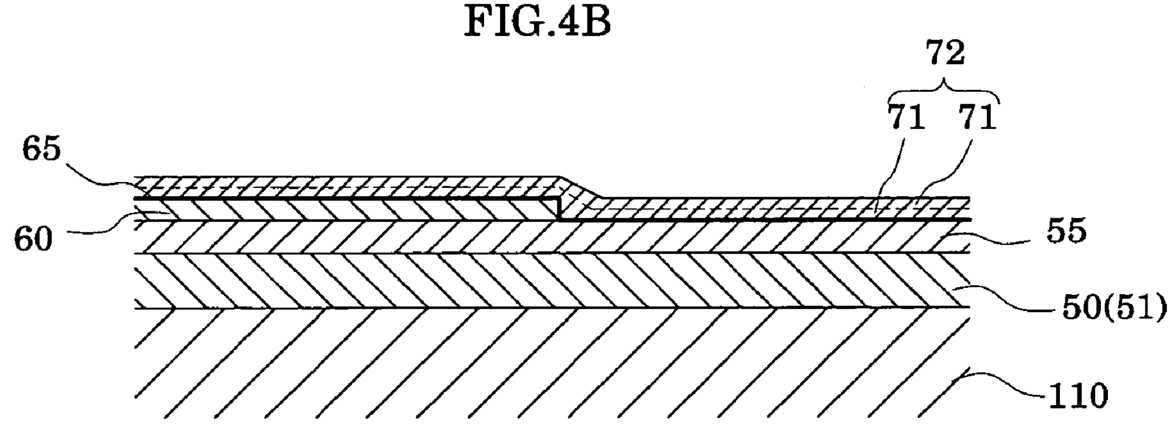

Then, the application process, the drying process and the degreasing process, which have been described above, are repeated for a predetermined number of times, for example, twice in the present embodiment. Thereby, the piezoelectric precursor film 71 is formed at a predetermined thickness as shown in FIG. 4B. Thereafter, the piezoelectric precursor film 71 is processed thermally in a diffusion furnace, and thus is crystallized. Accordingly, the piezoelectric film 72 is formed. In other words, by baking the piezoelectric precursor film 71, crystals are grown with the seed titanium layer 65 serving as nuclei, and accordingly the piezoelectric film 72 is formed. In the present embodiment, for example, the piezoelectric precursor film 71 is baked by heating it at a temperature of approximately 700° for 30 minutes, and thereby the piezoelectric film 72 is formed. Incidentally, the crystals of the piezoelectric film 72 thus formed are orientated in the (100) plane with priority.

Figure 4C:
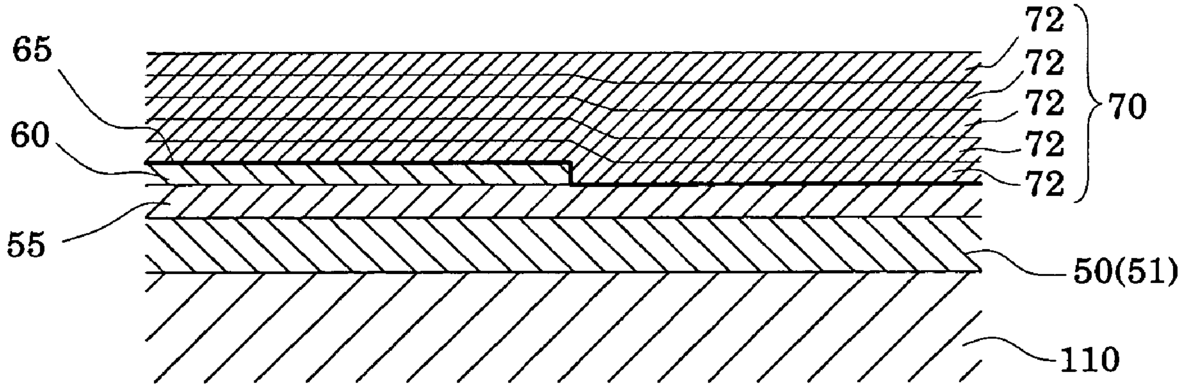

Furthermore, the application process, the drying process and the degreasing process, which have been described above, are repeated for a plurality of times. Thereafter, as shown in FIG. 4C, the piezoelectric layer 70, with a predetermined thickness, made of a plurality of the piezoelectric precursor films 72 is formed. In the present embodiment, the number of the piezoelectric precursor films 72 is 5. If a film thickness of the piezoelectric precursor film 71 to be formed by applying the sol once were, for example, approximately 0.1 μm, the entire film thickness of the piezoelectric layer 70 would be approximately 1 μm.

If the piezoelectric layer 70 were formed in the process which has been described above, this would enable characteristics of the piezoelectric layer 70 to be improved, and would enable the characteristics to be stabilized. In other words, the crystallinity, for example, a degree of orientation, strength, a particle diameter, and the like, of the piezoelectric layer 70 is apt to be affected by the ground for the piezoelectric layer 70. The more relatively rough the surfaces roughnesses Ra respectively of the lower electrode film 60 and the insulation film 55, which are the ground for the piezoelectric layer 70, are, the more the crystallinity tends to be improved. However, if the surface roughnesses would be too rough, the crystallinity would become bad. In the present invention, a control is performed in order that the surface roughness Ra of the insulation film 55 which is the uppermost layer constituting the vibration plate, and which serves as the ground for the piezoelectric layer 70, may be in the range of 1 nm to 3 nm. Thereby, a control is performed in order that the surfaces roughness Ra of the lower electrode film 60 may be in the range of 1 nm to 3 nm. Concurrently, the crystallinity of the piezoelectric layer 70 to be formed on this lower electrode film 60 is caused to be improved. This makes it possible to form the piezoelectric layer 70 with excellent electric and mechanical characteristics. In addition, unevenness of the characteristics of the piezoelectric layer 70 within the wafer can be suppressed to an extent of being extremely small.

In addition, this also makes it easier to control the crystallinity of the piezoelectric layer 70, thus enabling the piezoelectric layer 70 with desired characteristics to be manufactured relatively easily. Accordingly, performance in mass production is improved to a large extent. In other words, in the present invention, by performing a control in order that the surface roughness Ra of the insulation film 55 may be in the range of 1 nm to 3 nm, the characteristics of the piezoelectric layer 70 to be formed on the insulation film 55 can be improved relatively easily without rigidly controlling conditions for sputtering when the seed titanium layer 65 is formed on the insulation film 55, in comparison with a case where the surface roughness Ra of the insulation film is out of a predetermined range. In addition, the characteristics of the piezoelectric layer 70 can be stabilized relatively easily. Thereby, the yields can be improved.

It should be noted that, as a material for the piezoelectric layer 70, for example, relaxor ferroelectrics may be used; the relaxor ferroelectrics is obtained by adding metals such as niobium, nickel, magnesium, bismuth, yttrium to a ferroelectric-piezoelectric material such as lead-zirconate-titanate (PZT). Its composition may be selected depending on necessity with the characteristics of, the application of, and the like of, the piezoelectric element taken into consideration. For example, the following may be listed: $PbTiO_3$ (PT), $PbZrO_3$(PZ), $Pb(Zr_xTi_{1-x})O_3$ (PZT), $Pb(Mg_{1/3}Nb_{2/3})O_3$—$PbTiO_3$(PMN-PT), $Pb(Zn_{1/3}Nb_{2/3})O_3$—$PbTiO_3$(PZN-PT), $Pb(Ni_{1/3}Nb_{2/3})O_3$—$PbTiO_3$(PNN-PT), $Pb(In_{1/2}Nb_{1/2})O_3$—$PbTiO_3$(PIN-PT), $Pb(Sc_{1/3}Ta_{2/3})O_3$—$PbTiO_3$(PST-PT), $Pb(Sc_{1/3}Nb_{2/3})O_3$—$PbTiO_3$(PSN-PT), $BiScO_3$—$PbTiO_3$(BS-PT), $BiYbO_3$—$PbTiO_3$(BY-PT) and the like. In addition, the method of manufacturing a piezoelectric layer 70 is not limited to the sol-gel method. For example, an MOD (Metal-Organic Decomposition) method and the like may be used.

Figure 5A:
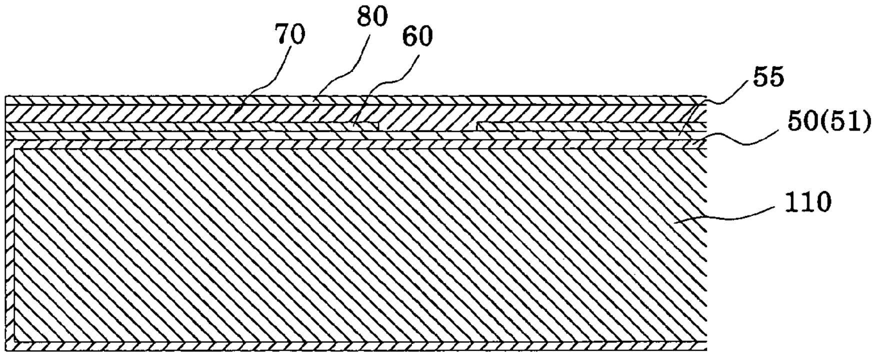
FIGS. 5(A) to 5(D) are cross-sectional views showing steps of manufacturing the recording head according to the first embodiment.
Figure 5B:
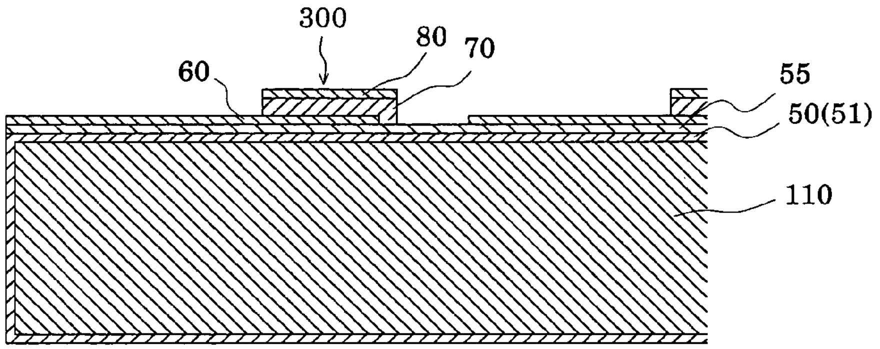
Figure 5C:
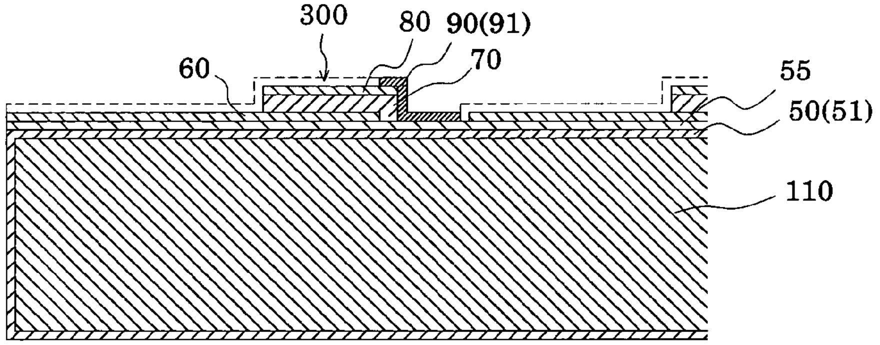

In addition, after the piezoelectric layer 70 is formed in the aforementioned manner, the upper electrode film 80 made, for example, of iridium is formed on the entire surface of the wafer 110 for the passage-forming substrate as shown in FIG. 5A. Subsequently, as shown in FIG. 5B, the piezoelectric layer 70 and the upper electrode film 80 are patterned in an area facing each of the pressure generating chambers 12, and thereby the piezoelectric elements 300 are formed. Then, the lead electrodes 90 are formed. Specifically, as shown in FIG. 5C, a metallic layer 91 made, for example, of gold (Au) or the like is formed on the entire surface of the wafer 110 for the passage-forming substrate. After that, the metallic layer 91 is patterned for each of the piezoelectric elements 300 through a mask pattern (not illustrated) made, for example, of resist or the like, and thus the lead electrodes 90 are formed.

Figure 5D:
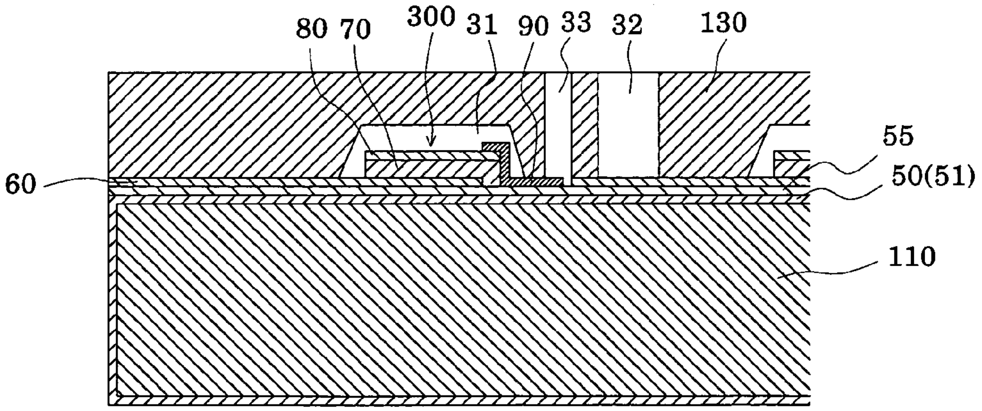

Subsequently, as shown in FIG. 5D, the wafer 130 for the protective plate, which is a silicon wafer, and which becomes a plurality of protective plates 30, is jointed to the wafer 110 for the passage-forming substrates on the side of the piezoelectric elements 300. Incidentally, the wafer 130 for the protective plate has a thickness, for example, of 400 μm. For this reason, by jointing (joining) the wafer 130 for the protective plate to the wafers 110 for the passage-forming substrate, the rigidity of the latter wafer 110 is improved to a large extent.

Figure 6A:
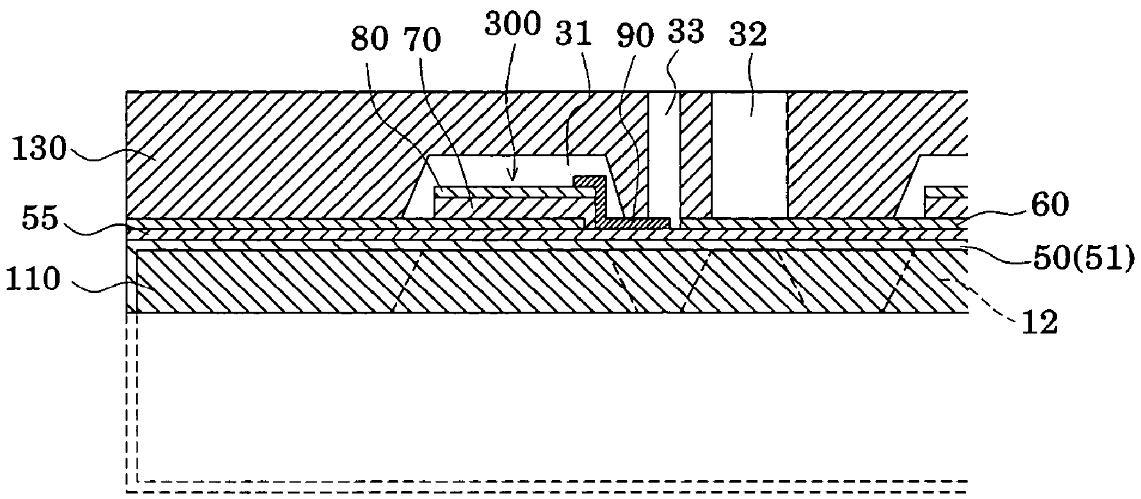
FIGS. 6(A) to 6(C) are cross-sectional views showing steps of manufacturing the recording head according to the first embodiment.
Figure 6B:
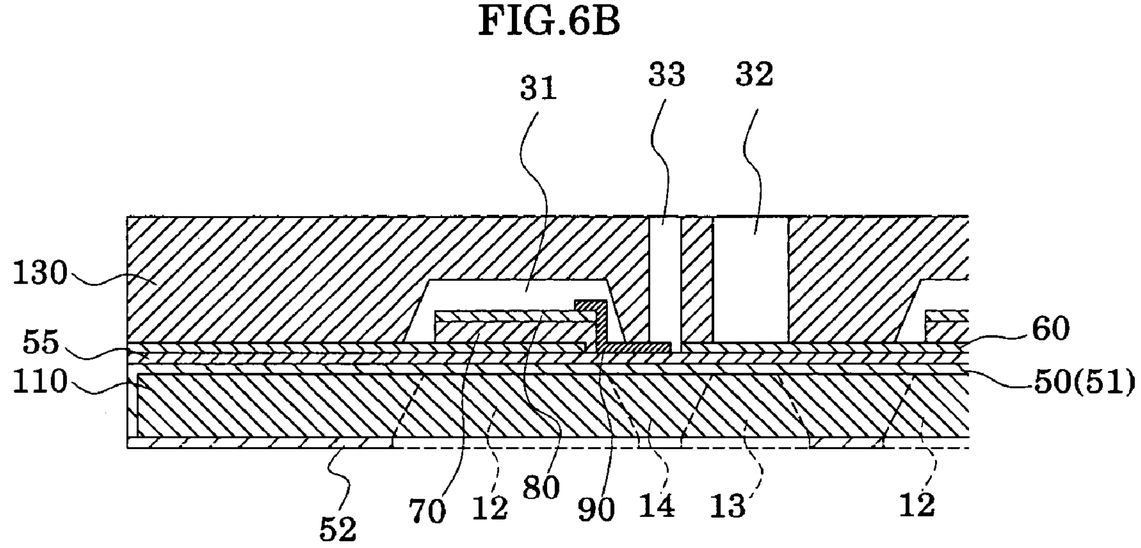
Figure 6C:
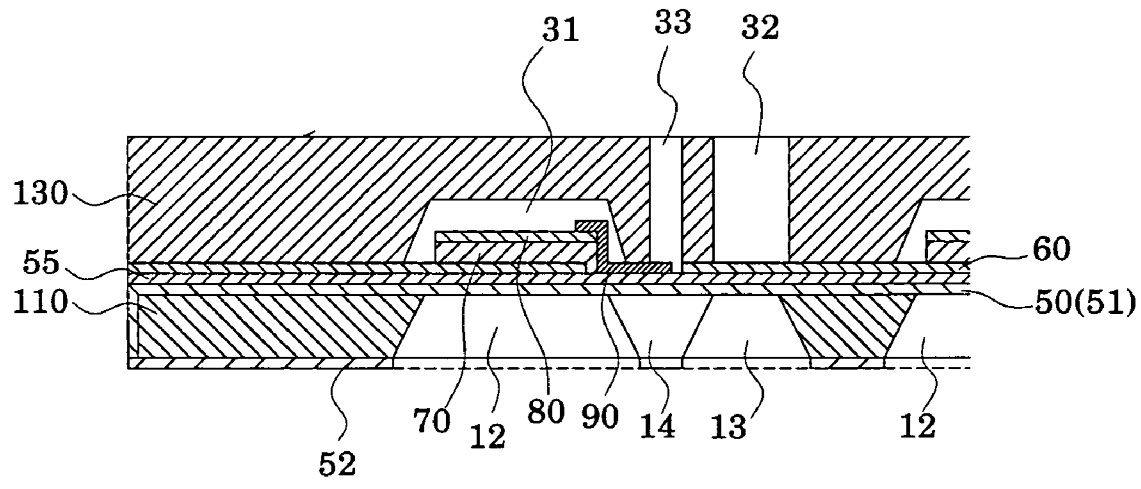

Then, as shown in FIG. 6A, the wafer 110 for the passage-forming substrates is polished to a certain thickness. Thereafter, a wet etching process is performed on the wafer 110 for the passage-forming substrate by use of fluoro-nitric acid. Thereby, the wafer 110 for the passage-forming substrate is caused to have a predetermined thickness. In the present invention, the etching process is performed on the wafer 110 for the passage-forming substrate to a thickness, for example, of approximately 70 μm. Thence, as shown in FIG. 6B, a masking film 52 made, for example, of silicon nitride (SiN) is newly formed on the wafer 110 for the passage-forming substrate, and is patterned into a predetermined shape. Then, the wafer 110 for the passage-forming substrate is etched anisotropically through the masking film 52. Thereby, as shown in FIG. 6C, the pressure generating chambers 12, the communicating path 13, the ink supply paths 14 and the like are formed in the wafer 110 for the passage-forming substrate.

It should be noted that, thereafter, unnecessary parts in the outer peripheral portions surrounding the wafer 110 for the passage-forming substrate and the wafer 130 for the protective plate are cut off by such means as dicing, and thus the unnecessary parts are removed. Then, the nozzle plate 20 in which the nozzle orifices 21 have been drilled is jointed to the surface of the wafer 110 for the passage-forming substrate, the surface being a surface which does not face the wafer 130 for the protective plate. In addition, the compliance plate 40 is jointed to the wafer 130 for the protective plate. Then, the wafer 110 for the passage-forming substrate and the like are divided into the passage-forming substrate 10, and the like, which have a chip size as shown in FIG. 1. Thereby, the ink-jet recording head according to the present invention is formed.

Figure 7A:
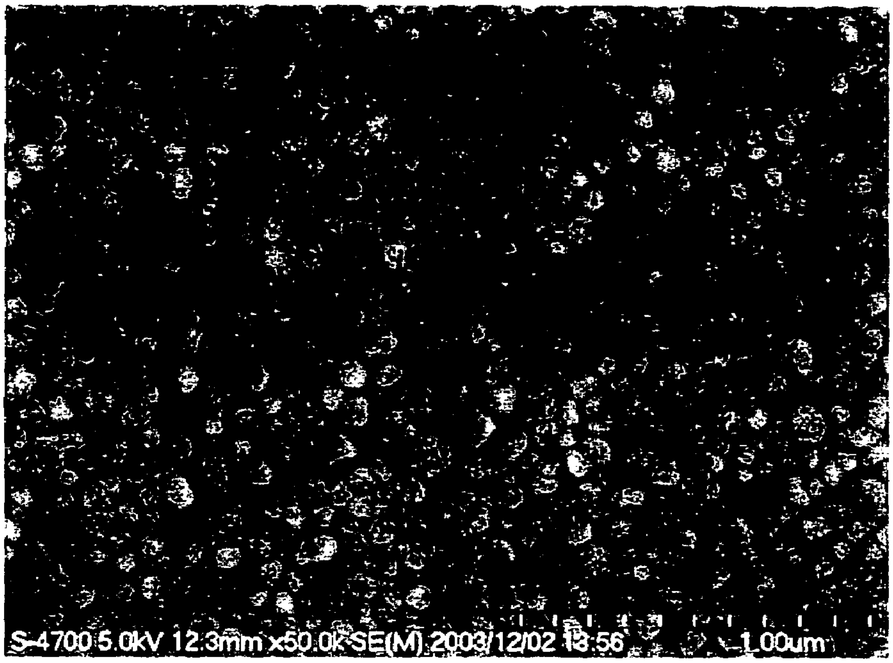
FIG. 7(A) is an SEM photograph showing a surface of a piezoelectric layer according to the first embodiment.

Here, an ink-jet recording head which has been manufactured by use of the aforementioned method is the ink-jet recording head according to the first embodiment, except that the insulation film is formed by depositing the zirconium layer with its surface roughness Ra of approximately 2.2 nm on the elastic film by use of a sputtering pressure of approximately 0.5 Pa, a sputtering output of 500 W and a target interval (distance between a target and the substrate) of approximately 65 mm, and thereafter by oxidizing the zirconium layer thermally at a temperature of approximately 700° C. to 900° C. for approximately 15 to 60 minutes. The surface roughness Ra of the piezoelectric layer (PZT layer) of the head according to the first embodiment was approximately 2.1 nm. FIG. 7A is a SEM (Scanning Electron Microscope) photograph showing the surface of the piezoelectric layer according to the first embodiment.

Figure 7B:
FIG. 7(B) is an SEM photograph showing a surface of a piezoelectric layer according to a first comparative example.

For a comparison purpose, an ink-jet recording head, which has been manufactured by use of a method which is the same as the method according to the first embodiment, is the ink-jet recording head of a first comparative example, except for conditions for the sputtering process to be performed while the zirconium layer is being formed are 0.3 Pa for the sputtering pressure, 1,000 W for the sputtering output, and 170 mm for the target interval. The surface roughness Ra of the piezoelectric layer (PZT) of the head of this first comparative example was approximately 0.8 nm. FIG. 7B is a SEM photograph showing the surface of the piezoelectric layer of the first comparative example.

As shown in FIGS. 7A and 7B, it can be confirmed that the layer of the piezoelectric layer according to the first embodiment is finer than that of the piezoelectric layer according to the first comparative example. In addition, when a comparison was made between the head according to the first embodiment and the head according to the first comparative example in terms of characteristics of the respective piezoelectric elements (piezoelectric layers), it has been learned that the head according to the first embodiment is better than the head according to the first comparative example in terms of the characteristics of their respective piezoelectric layers.

OTHER EMBODIMENTS

Descriptions have been provided for the embodiment of the present invention. However, the present invention is not limited to the aforementioned embodiment. For instance, in the aforementioned embodiment, the ink-jet recording head has been presented as an example of the head to be used for the liquid jet head. However, the present invention is applicable broadly to liquid jet heads as whole. It goes without saying that the present invention can be applied to a head from which to eject a liquid other than ink. As other liquid jet heads, the followings can be listed: various recording heads to be used for image recording apparatuses such as a printer; a color material jet head to be used for manufacturing color filters of a liquid crystal display and the like; an electrode material jet head to be used for forming electrodes of an organic EL display, a field emission display (FED) and the like; a bio-organic matter jet head to be used for manufacturing biochips; and the like. Furthermore, the present invention can be applied not only to an actuator device to be mounted, as liquid ejecting means, on such a liquid jet head (ink-jet recording head), but also to an actuator device to be mounted on all the other devices. For example, the actuator device can be applied to the aforementioned head, and additionally to a sensor and the like.

What is claimed is:

1. A method of manufacturing an actuator device which comprises the steps of:

forming a vibration plate on one side of a substrate; and forming on the vibration plate, a piezoelectric element including a lower electrode, a piezoelectric layer, and an upper electrode, wherein the step of forming the vibration plate includes a step of forming a zirconium layer, and thermally oxidizing the zirconium layer at a predetermined temperature to form an insulation film made of zirconia, the insulation film being an uppermost layer of the vibration plate and having a surface roughness ranging from 1 nm to 3 nm, and wherein the step of forming the piezoelectric element includes a step of applying titanium onto the lower electrode by use of a sputtering method, and forming a seed titanium layer thereon; and a step of forming a piezoelectric precursor film by applying a piezoelectric material onto the seed titanium layer, and forming the piezoelectric layer by baking and crystallizing the piezoelectric precursor layer.

2. The method of manufacturing an actuator according to claim 1, wherein, in the step of forming the insulation film, the surface roughness of the insulation film is caused to be larger than 2 nm.

3. The method of manufacturing an actuator according to claims 1, wherein, in the step of forming the insulation film, the degree of orientation of the (002) plane of the zirconium layer is caused to be not smaller than 80%.

4. The method of manufacturing an actuator according to claims 1, wherein, while the zirconium layer is being oxidized thermally, the heating temperature is equal to, or lower than, 900° C.

5. The method of manufacturing an actuator according to claim 1, wherein, in the step of forming the seed titanium layer, the seed titanium layer is formed at a thickness of 1 nm to 8 nm.

6. The method of manufacturing an actuator according to claim 1, wherein, while the seed titanium layer is being formed, the power density is 1 $kW/m^2$ to 4 $kW/m^2$.

7. The method of manufacturing an actuator according to claim 1, wherein, in the step of forming the seed titanium layer, titanium is applied onto the lower electrode two times or more.

* * * * *